US012730170B2

(12) United States Patent
Grodzki

(10) Patent No.: US 12,730,170 B2
(45) Date of Patent: Sep. 8, 2026

(54) POINTWISE ENCODING TIME REDUCTION WITH RADIAL ACQUISITION (PETRA) TECHNIQUES WITH REDUCED COMPUTATIONAL COMPLEXITY

(71) Applicant: Siemens Healthineers AG, Forchheim (DE)

(72) Inventor: David Grodzki, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 19/228,918

(22) Filed: Jun. 5, 2025

(65) Prior Publication Data

US 2025/0377429 A1 Dec. 11, 2025

(30) Foreign Application Priority Data

Jun. 7, 2024 (DE) ..................... 10 2024 205 243.4

(51) Int. Cl.

*G01V 3/00* (2006.01)
*G01R 33/54* (2006.01)
*G01R 33/56* (2006.01)
*G01R 33/561* (2006.01)

(52) U.S. Cl.

CPC ....... *G01R 33/5615* (2013.01); *G01R 33/543* (2013.01); *G01R 33/5608* (2013.01)

(58) Field of Classification Search

CPC .............. G01R 33/5615; G01R 33/543; G01R 33/5608
USPC .......................................................... 324/309
See application file for complete search history.

(56) References Cited

U.S. PATENT DOCUMENTS

| | | | |
|---|---|---|---|
| 8,878,533 | B2 | 11/2014 | Grodzki et al. |
| 2014/0028313 | A1 | 1/2014 | Paul |
| 2019/0369195 | A1 | 12/2019 | Zeller |
| 2020/0363484 | A1 | 11/2020 | Froidevaux et al. |
| 2021/0093222 | A1 | 4/2021 | Dispenza et al. |
| 2022/0050159 | A1 | 2/2022 | Paul et al. |

(Continued)

FOREIGN PATENT DOCUMENTS

| | | | | |
|---|---|---|---|---|
| CN | 103576114 | A | 2/2014 | |
| CN | 115137346 | A | 10/2022 | |
| DE | 102016218557 | A1 * | 3/2018 | ........... G01R 33/385 |

OTHER PUBLICATIONS

Nlelles-Vallespin S. et al: "3D Radial Projection Technique with Ultrashort Echo Times for Sodium MRI: Clinical Applications in Human Brain and Skeletal Muscle", Magn. Res. Med. 2007; 57; S. 74-81.

(Continued)

*Primary Examiner* — Walter L Lindsay, Jr.
*Assistant Examiner* — Frederick Wenderoth
(74) *Attorney, Agent, or Firm* — Banner & Witcoff, Ltd.

(57) ABSTRACT

In the context of a method according to the disclosure for generating measurement data from an imaging area in a measurement volume of a magnetic resonance system, using a PETRA method, a pulse duration of at least one RF excitation pulse radiated during a single-shot recording method of the PETRA method is extended compared to a pulse duration of RF excitation pulses radiated during a radial recording method of the PETRA method, whereby computing operations for correcting disruptive aliasing may be simplified.

11 Claims, 5 Drawing Sheets

(56) References Cited

U.S. PATENT DOCUMENTS

| | | | |
|---|---|---|---|
| 2022/0317217 | A1 | 10/2022 | Carinci et al. |
| 2024/0175956 | A1 | 5/2024 | Grodzki |

OTHER PUBLICATIONS

Weiger Markus et al: "MRI with Zero Echo Time: Hard versus Sweep Pulse Excitation", in: Magnetic Resonance in Medicine, vol. 66, 2011, pp. 379-389, DOI: 10.1002/mrm.22799

Balcom et al: "Single-Point Ramped Imaging with T1 Enhancement (SPRITE)"; Journal of Magnetic Resonance, Series A 123, 131-134 (1996).

Grodzki M. et al: "Correcting Slice Selectivity in Hard Pulse Sequences", Journal of Magnetic Resonance; vol. 214 (2012); pp. 61-67; DOI: 10.1016/j.jmr.2011.10.005; 2012.

Heid/Deimling: "Rapid Single Point (RASP) Imaging", SMR, 3rd Annual Meeting, p. 684, 1995.

Wu Yaotang et al: "Density of Organic Matrix of Native Mineralized Bone Measured by Water- and Fat-Suppressed Proton Projection MRI", Magn. Reson. Med. 50:S. 59-68, 2003.

Mar. 5, 2025 (DE) Office Action—App. 102024205243.4 (w/ English translation).

Jul. 10, 2025 (DE) Decision to Grant—App. 102024205243 (w/ English translation).

* cited by examiner a)

b)

101
101.1
Ramp up gradient G1
101.3
Radiate excitation pulse RF1
101.5
Store measurement data MDS1
100
n
MDS1 recorded in all encoding directions?
MDS1
Dm
105
Set maximum duration Dm
103
103.1
Switch gradients G2
103.3
Radiate excitation pulse RF2
103.5
Store measurement data MDS2
100'
n
MDS2 recorded in all k-space positions?
MDS2
107
Reconstruct image data BD
BD 1
3
U
7.1
7.2
5
L
$S_i$
7
9
RF controller
7'
Gradient controller
5'
13
Controller
S
15
Storage
Adapting controller
26
I/O

POINTWISE ENCODING TIME REDUCTION WITH RADIAL ACQUISITION (PETRA) TECHNIQUES WITH REDUCED COMPUTATIONAL COMPLEXITY

CROSS-REFERENCE TO RELATED APPLICATIONS

The present application claims priority to and the benefit of Germany patent application no. DE 10 2024 205 243.4, filed on Jun. 7, 2024, the contents of which are incorporated herein by reference in their entirety.

TECHNICAL FIELD

The disclosure relates to an improvement of a pointwise encoding time reduction with radial acquisition (PETRA) technique.

BACKGROUND

Magnetic resonance (MR) technology is a known technology with which images may be created from the inside of an examination object. Expressed in simple terms, the examination object is positioned in a magnetic resonance device in a comparatively strong, static, homogeneous basic magnetic field, also called a B0 field, with field strengths from 0.2 tesla to 7 tesla and more, so that its nuclear spins are oriented along the basic magnetic field. To trigger nuclear spin resonances measurable as signals, radiofrequency excitation pulses (RF pulses) are radiated into the examination object, the nuclear spin resonances triggered are measured as what is known as k-space data, and MR images are reconstructed or spectroscopy data established on the basis of said data. The alternating magnetic field generated by the excitation pulses radiated by at least one transmitter coil is also referred to as the B1 field. For spatial encoding of the measurement data, rapidly switched magnetic gradient fields are superimposed on the basic magnetic field. A scheme used that describes a temporal sequence of RF pulses to be radiated and gradients to be switched is called a pulse sequence (scheme), or sequence for short. The acquired measurement data is digitized and stored as complex numerical values in a k-space matrix. From the k space matrix populated by values, an associated MR image may be reconstructed for example by means of a multidimensional Fourier transform.

SUMMARY

It is not possible to represent by means of MR sequences matter or tissue whose T2* time, the effective decay of the cross magnetization of this matter or tissue, is considerably shorter than the shortest possible echo times in these sequences, as a corresponding signal from such matter or tissue has already decayed at the time of recording.

It is therefore not possible by means of conventional sequences, such as a (T)SE ((Turbo) Spin Echo) sequence or a GRE (Gradient Echo) sequence for example, to record matter or tissue, such as bones, tendons, ligaments, teeth, or even ice, with T2* times considerably shorter than 500 microseconds (μs).

However, there are already MR methods known that allow for very short echo times TE (for example TE<500 μs), which fall within the range of the corresponding decay time. In this way it is possible, for example, to represent bones, tendons, ligaments, teeth, or ice in an MR image, even though the T2* time of such matter or tissue falls within a range of 30-80 μs.

These MR methods include the UTE (Ultrashort Echo Time) sequence, as described inter alia in the article by Sonia Nielles-Vallespin entitled "3D radial projection technique with ultrashort echo times for sodium MRI: Clinical applications in human brain and skeletal muscle", Magn. Res. Med. 2007; 57; pp. 74-81. With this type of sequence, data acquisition is started after a waiting time following a non- or layer-selective excitation at the same time as the gradients are started up for spatial encoding. The k-space trajectory scanned in this way following an excitation runs radially outwards from the k-space center. Therefore, before reconstruction of the image data from the raw data recorded in the k-space, this raw data must first be converted by Fourier transformation, for example by re-gridding into a Cartesian k-space grid.

Other MR methods allowing particularly short echo times are ZTE (zero echo time) and PETRA (pointwise encoding time reduction with radial acquisition) or also WASPI (water- and fat-suppressed proton projection MRI) sequences which are, for example, described in the article by Weiger et al., "MRI with Zero Echo Time: Hard versus Sweep Pulse Excitation" Magnetic Resonance in Medicine 66: pp. 379-389, 2011, in U.S. Pat. No. 8,878,533B2 (PETRA) and in the article by Wu et al., "Density of Organic Matrix of Native Mineralized Bone Measured by Water- and Fat-Suppressed Proton Projection MRI", Magn. Reson. Med. 50: pp. 59-68, 2003. In both methods, measurement data is recorded in the k-space along radial spokes, the gradients of which, switched for spatial encoding, have already been fully ramped up at the time of excitation of the spins in an examination object, saving valuable encoding time. However, this also results at the k-space center in an area which cannot be scanned by these radial spokes. Compared to UTE methods, ZTE and PETRA methods are more robust since Eddy currents, or unwanted, small time shifts of switched gradients or radiated RF pulses, have no or at most a negligible influence on the measurements.

An example of a pulse sequence for such a recording of measurement data along radial spokes, as used in ZTE methods and PETRA methods, is shown in FIG. 1. The top line "Tx/Rx" shows the radiated RF excitation pulse RF1 and the readout windows ADC, during which the recording of the measurement data takes place. The middle line "G1" shows the gradients switched in an encoding direction, each of which, at the time of radiation of an RF excitation pulse RF1, has reached its desired strength for the next recording of measurement data. The bottom line "k-sp" shows the corresponding k-space positions scanned along the k-space trajectory specified by the gradient field applied for recording of the measurement data. The measured k-space positions are shown as black dots and k-space positions located prior to the start of the readout window, and therefore read out as "empty" dots. The reason the k-space positions are not read out is due to the fact that, as described, a constant gradient field is already applied before the RF excitation pulse RF is radiated. Otherwise, the central k-space point ($k_0$) would have to be measured at the same time as the RF excitation pulse RF1 is radiated, which is not technically possible. Only after the minimum necessary switching time Ts, dependent upon the hardware of the magnetic resonance system used, following the end of the RF excitation pulse RF1 may the recording of the measurement data in the readout window ADC begin, as a result of which the shortest possible echo time also results. The first k-space position k* read out in the readout window ADC has the minimum distance from the k-space center $k_0$ among the k-space positions read out. The last k-space position $k_{max}$ read out in the readout window ADC has the maximum distance from the k-space center $k_0$ among the k-space positions read out. The duration of the readout window ADC (acquisition time) is given by the strength of the applied gradient field G1 and the required resolution or desired field of view (FOV) or the matrix of the image to be generated from the measurement data.

An associated scanning scheme of the k-space is shown in FIG. 2, a radial k-space spoke corresponding to a k-space trajectory along which measurement data is recorded in a readout window ADC. In area B1, measurement data is recorded along radial spokes in various encoding directions, until for example a desired density of the scanning is reached in the k-space. The radius of the central area B2 in which no measurement data is recorded along the described radial spokes (because the value of a distance of a k-space position k is smaller than k*) depends on the k-space moment accumulated after excitation and up until recording of the measurement data, and thus on the echo time TE, in which the gradient is switched with constant strength, and the strength of the switched gradient field. The longer this echo time TE is, and the stronger the gradient strength and thus the higher the readout bandwidth are, the more k-space positions there will be that are not measured on the radial k-space trajectory.

MR data from this area B2 not radially scanned may be reconstructed algebraically using ZTE methods from the measurement data of the radial spokes. In WASPI methods, a small number of further measurements are carried out along second radial k-space trajectories, the strength of the gradients being reduced for further measurement data to be recorded closer to the k-space center.

With PETRA methods measurement data may be recorded from the area B2 not radially scanned by means of an MR single point imaging method such as RASP (“rapid single point”) as described for example in the article by Heid et al. entitled “Rapid Single Point (RASP) imaging”, Proc. Intl. Soc. Mag. Reson. Med., p. 684, 1995, or a “single point SPRITE” method as described for example in the article by Balcom et al. entitled “Single-Point Ramped Imaging with T1 Enhancement (SPRITE)”, J. Magn. Reson. A 123(1): pp. 131-134, 1996, in particular on a Cartesian grid. This is shown in FIG. 2 in a rough schematic by filled dots in area B2, which represent the individually recorded k-space positions.

The MR single point imaging method used, which for example may be performed in a measurement step separate from the recording of the radially recorded measurement data, measures individual k-space positions respectively at a point in time TE after radiation of an RF excitation pulse RF2 respectively in a readout window ADC, the respective strength of the gradients G2 switched for spatial encoding being respectively adjusted such that in the k-space the precise desired k-space position is reached. The gradients G2 are changed by means of the magnetic resonance system for each k-space position as shown schematically in FIGS. 3*a* and 3*b* for a RASP single point imaging method.

The fact that the gradients are already switched on upon excitation in PETRA, ZTE, and WASPI methods has the disadvantage that they limit the possibilities for excitation. Whereas 2D or other flexible 3D excitation pulses are possible with UTE methods, with ZTE- or PETRA-type methods the excitation must take place with a shortest possible rectangular pulse, also known as a “hard pulse.” As described in the article by Grodzki et al. entitled “Correcting slice selectivity in hard pulse sequences”, Proc. Intl. Soc. Mag. Reson. Med. 20, p. 2479, 2012, despite using such spatially non-selective hard pulses as the RF excitation pulse, precisely because of the gradients already switched during the radiation of the RF excitation pulse an undesired slice excitation results, during which depending on the scanned k-space trajectory aliasing by a different spectral pulse profile dependent on the switched gradients, for example sync-shaped, occurs in the image. This disturbance may be described as the aliasing of a pulse profile P(x,k) dependent both on the spatial domain (x) and the k-space (k) in the magnetization distribution f(x). This results in a k-space F'(k) disturbed by the overlaying of the pulse profile P(x,k) as shown in Equation 1 below:

$$F'(k)=\sum_x f(x)P(x,k)e^{ikx}. \quad [1]$$

FIG. 4 replicates a figure from the cited article by Grodzki et al. and shows schematically the full width half maximum (FWHM) of exemplary pulse profiles of RF excitation pulses used in the image along a line through the k-space in the context of a PETRA sequence. For k-space positions with a distance |k| from the k-space center, which is greater than the distance of k* from the k-space center (k≥k*), and thus the radial part of the recording of the measurement data, the value of the gradient strength G(k) is the same in each case. Thus, a disturbance from the superimposition of the respective pulse profile is also the same. Between −k* and k*, and thus in the part of the recording of the measurement data that takes place by an MR single point imaging method, the gradient strength G(k) behaves proportionally to the distance |k| of the respective k-space position k from the k-space center. Thus, the gradient strength G(k) is lower for |k|<k* than for |k|≥k*. If the gradient strength G(k) is low, the full width half maximum FWHM increases, whereby zero crossings of the pulse profile slip further outwards and thus the disruptive influence of the pulse profile on the reconstructed MR image is considerably less.

The correction method described in the cited article by Grodzki et al. for correcting the disturbances caused by the unwanted slice selection, is based on the fact that by a matrix inversion the stated complex and k-space-dependent aliasing is already recalculated with the Fourier transformation of the image reconstruction. A computing operation required for this correction method however may firstly be quite time-consuming-especially in cases of high gradient strengths, for example if a strength used of the first gradient G1 is more than 15 mT/m for an isotropic resolution of 1 mm and a matrix size of approximately $256^3$—and secondly, by way of such a matrix inversion, a noise (especially outside of the first minimum of the slice profile) may be generated such that an evaluation is no longer possible there.

The object of the disclosure is to correct disturbances in PETRA methods caused by a described unwanted slice selection and so to enable improved PETRA methods, which may require no (or reduced) computationally intensive mathematical computing operations.

The object is achieved by the various embodiments described herein, which includes methods, a magnetic resonance system, a computer program, and an electronically readable data carrier as described herein, including the claims, for generating measurement data from an imaging area of an examination object located in a measurement volume of a magnetic resonance system.

A method according to the disclosure for generating measurement data from an imaging area of an examination object located in a measurement volume of a magnetic resonance system comprises the steps:

reading out a k-space corresponding to the imaging area, comprising the substeps:

a) starting up a first gradient, until this has reached a first strength in a desired encoding direction, by means of a gradient unit of a magnetic resonance system;

b) radiating a first RF excitation pulse, while the first gradient has the first strength, by means of a radiofrequency transmit/receive control of the magnetic resonance system;

c) recording first echo signals generated by the first RF excitation pulse by means of c) the radiofrequency transmit/receive control after a switching time following radiation of a first RF excitation pulse;

d) storing the recorded first echo signals as first measurement data along the k-space trajectory given by the first strength of the switched first gradient and the desired encoding direction, steps a) to d) being repeatedly carried out with constant first gradients switched in various desired encoding directions, until the k-space corresponding to the imaging area is read out from a first area dependent upon the switching time, the various encoding directions being composed of at least two phase encoding directions;

reading out a second area of the k-space corresponding to the imaging area, which at least partially is not masked by the first area of the k-space, and which comprises at least the k-space center, with a single-shot recording method, with which after repeated radiation respectively of a second RF excitation pulse, excited second echo signals are recorded with switching of second gradients for encoding for a respective k-space position of the second area and stored as second measurement data until all desired k-space positions of the second area have been recorded;

reconstructing image data from the recorded first measurement data and the recorded second measurement data, a pulse duration of at least one of the second RF excitation pulses being extended compared with a pulse duration of a first RF excitation pulse for the recording of second echo signals of at least one k-space position in the second area.

The method according to the disclosure may thus be characterized as a method for generating measurement data from an imaging area of an examination object located in a measurement volume of a magnetic resonance system using a PETRA method, in which a pulse duration of at least one RF excitation pulse radiated during a single-shot recording method of the PETRA method is extended compared with a pulse duration of RF excitation pulses radiated during a radial recording method of the PETRA method.

Through the extension according to the disclosure of a pulse duration of at least a second RF excitation pulse (i.e. an extension of the duration of at least a second RF excitation pulse) compared with the pulse duration of first RF excitation pulses (i.e. the duration of the first RF excitation pulses), a pulse profile of an extended second RF excitation pulse is changed, whereby unwanted aliasing of the pulse profiles is similarly changed. As a result, it may for example be ensured that a dependency of a pulse profile of the first RF excitation pulse on a k-space position of first measurement data and a dependency of the pulse profile of an extended second RF excitation pulse of a k-space position of associated second measurement data are aligned, whereby computing operations to correct the disruptive aliasing are simplified.

In an embodiment, it may be ensured that a dependency of the pulse profiles on the k-space position of the respectively recorded measurement data is reduced until it completely disappears or at least becomes negligibly small, whereby instead of the previously necessary computationally intensive matrix inversion a simple division by the pulse profile P(x) that is now dependent only upon the spatial domain (x) is necessary to correct the aliasing. In this way, the reconstruction of image data may be considerably simplified and accelerated. An increase in noise in areas outside the first zero crossings of pulse profiles of RF excitation pulses used may also be eliminated by an extension according to the disclosure of the pulse duration of second RF excitation pulses, so that the quality of image data obtained is increased, and overall considerably fewer restrictions due to the unwanted slice selection remain.

The method may take place without the involvement or knowledge of the operator, and thus without any demands on a user.

The method is particularly important for systems with strong gradients, such as Cima.X, since with strong gradients the proportion of single points increases, which slows down or crashes the reconstruction with matrix inversion as previously required according to the state of the art.

A magnetic resonance system according to the disclosure comprises a magnet unit, a gradient unit, a radiofrequency unit, and a control device with a pulse duration adaptation unit designed for performing a method according to the disclosure.

A computer program according to the disclosure implements a method according to the disclosure on a control device, when it is executed on the control device. For example, the computer program may comprise instructions and/or commands which, upon execution of the program by a control device, for example a control device of a magnetic resonance system, cause this control device to carry out a method according to the disclosure. The control device design may be in the form of a computer.

The computer program may also be present in the form of a computer program product, which may be directly loaded into a memory of a control device, with program code means for carrying out a method according to the disclosure, when the computer program product is executed in a computing unit of the computer system.

A computer-readable storage medium according to the disclosure comprises commands which, when executed by a control device, for example a control device of a magnetic resonance system, cause this to carry out a method according to the disclosure.

The computer-readable storage medium may be designed as an electronically readable data carrier, which comprises electronically readable control information stored thereon, which comprises at least a computer program according to the disclosure and is designed such that when the data carrier is used in a control device of a magnetic resonance system it carries out a method according to the disclosure.

The advantages and statements concerning the method also apply analogously to the magnetic resonance system, the computer program product, and the electronically readable data carrier.

BRIEF DESCRIPTION OF THE DRAWINGS

Further advantages and details of the present disclosure are specified in the exemplary embodiments described below and based on the drawings. The examples given are not intended to limit the disclosure in any way.

In the drawings.

DETAILED DESCRIPTION OF THE DISCLOSURE

Figure 5:
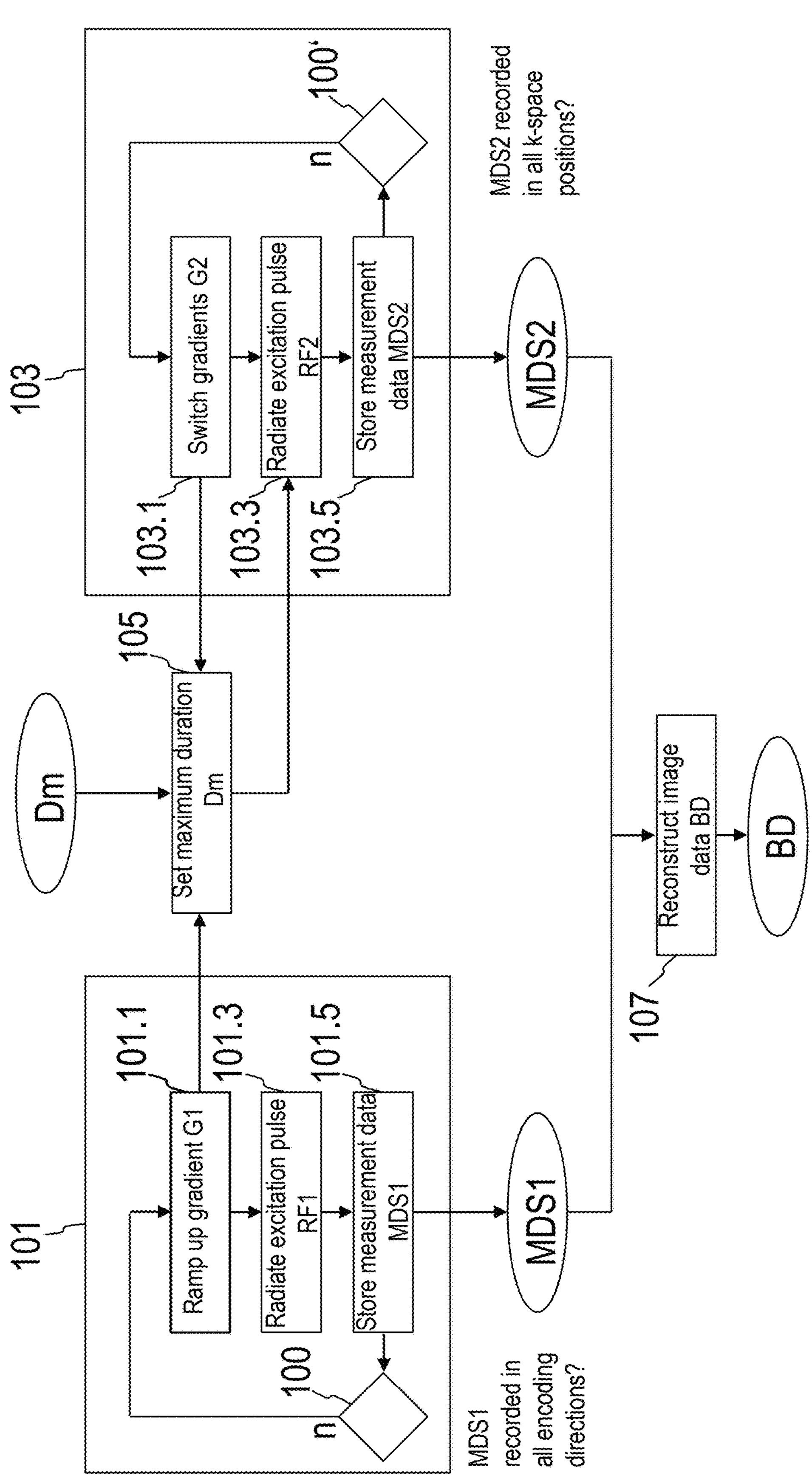
FIG. 5 illustrates a schematic flow chart of an example method for generating measurement data from an imaging area of an examination object located in a measurement volume of a magnetic resonance system, in accordance with one or more embodiments of the present disclosure.

FIG. 5 is a schematic flow chart of a method according to the disclosure for generating measurement data from an imaging area of an examination object located in a measurement volume of a magnetic resonance system.

In a first area B1 of the k-space corresponding to the imaging area, first measurement data MDS1 is recorded (Block 101).

At the same time, by means of a gradient unit of the magnetic resonance system a first gradient G1 is ramped up until this has reached a first strength in a desired encoding direction (Block 101.1).

While the first gradient G1 has the first strength, i.e. while the first gradient G1 is constantly present with the first strength, by means of a radiofrequency transmit/receive control of the magnetic resonance system a first RF excitation pulse RF1 is radiated (Block 101.3).

First echo signals generated by the first RF excitation pulse RF1 are recorded by means of the radiofrequency transmit/receive control of the magnetic resonance system after a switching time Ts following radiation of a first RF excitation pulse RF1 and stored as first measurement data MDS1 along the k-space trajectory given by the first strength of the switched gradients and the desired encoding (Block 101.5).

Blocks 101.1 to 101.5 are repeatedly carried out with constant first gradients G1 switched in various desired encoding directions, until the k-space corresponding to the imaging area is read out from a first area B1 dependent upon the switching time Ts, the various encoding directions being composed of at least two phase encoding directions. To this end, a query 100 may check that first measurement data MDS1 has already been recorded in all desired encoding directions, and, if not ("n"), initiate a further recording of first measurement data in a further desired encoding direction.

A second area B2 of the k-space corresponding to the imaging area, which at least partially is not masked by the first area B1 of the k-space, and which comprises at least the k-space center, is recorded with a single-shot recording method, excited second echo signals for one k-space position each being recorded after an excitation by an RF excitation pulse RF2 and stored as second measurement data MDS2 (Block 103).

At the same time, by means of the gradient unit of the magnetic resonance system second gradients G2 for encoding second echo signals to be recorded are switched (Block 103.1).

For excitation of the second echo signals to be recorded second RF excitation pulses RF2 are radiated (Block 103.3), a pulse duration of at least one of the second RF excitation pulses being extended compared with a pulse duration of a first RF excitation pulse for the recording of second echo signals of at least one k-space position in the second area B2.

After each radiated second RF excitation pulse RF2, excited second echo signals are recorded by means of the radiofrequency transmit/receive control of the magnetic resonance system and stored as second measurement data for one k-space position per radiated second RF-excitation pulse RF2 (Block 103.5). The recording of second echo signals takes place e.g. after an echo time TE corresponding to the switching time Ts following radiation of the respective second RF excitation pulse RF2, so that first measurement data MDS1 and second measurement data MDS2 are recorded with the same smallest echo times.

The extension of the pulse duration of the at least one second RF excitation pulse RF2 may take place here in such a way that a dependency of a pulse profile of the first RF excitation pulse RF1 on a k-space position of first measurement data and a dependency of the pulse profile of an extended second RF excitation pulse on a k-space position of associated second measurement data are aligned, e.g. that a dependency of a full width half maximum of a pulse profile of the first RF excitation pulse RF1 on a k-space position of first measurement data and a dependency of a full width half maximum of a pulse profile of an extended second RF excitation pulse on a k-space position of associated second measurement data are aligned.

First RF excitation pulses may and will generally always be selected uniformly, e.g. with the same pulse duration (duration of the radiation of an RF excitation pulse). Furthermore, first RF excitation pulses RF1 are radiated in each case with switching of first gradients G1, which in each case have the first strength (albeit in different encoding directions). Therefore first RF excitation pulses have the same pulse profiles for all radiated first RF excitation pulses RF1, which are thus not dependent upon the k-space position of the respective first measurement data MDS1.

As described above, second gradients G2, however, have different strengths, that are lower than the first strength of the first gradient G1, and which bring about a dependency of the pulse profiles of second RF excitation pulses on the k-space position of the respective associated second measurement data MDS2.

The disclosure is based on the knowledge that through an extension of the pulse duration of a second RF excitation pulse RF2 a pulse profile of the extended second RF excitation pulse may be changed such that the desired alignment of the dependency of a pulse profile of a first RF excitation pulse on a k-space position of first measurement data, which was recorded as first echo signals following excitation by the first RF-excitation pulse RF1, with the dependency of a pulse profile of an extended second RF excitation pulse on the k-space position of second measurement data, which was recorded as second echo signals following excitation by the extended second RF-excitation pulse RF2, and thus even elimination of the dependency of the pulse profiles of extended second RF excitation pulses RF2 on a k-space position of the respective associated second measurement data MDS2, may be achieved.

This may be explained as follows: Although an extension of a pulse duration of a second RF excitation pulse (with otherwise unchanged parameters) is generally accompanied by a sharpening of a (spectral) profile of the second RF excitation pulse and thus a reduction in the full width half maximum of the profile of the second RF excitation pulse, the (as already described e.g. in relation to FIG. 4) lower strength switched second gradients G2 compared with the first strength of the first gradients G1 have an opposite effect, namely a broadening of the profile of a second RF excitation pulse compared with a profile of a first RF excitation pulse. This broadening of the profile of the second RF excitation pulse RF2 for $|k|<k^*$ may be eliminated or at least decreased by an extension of a pulse duration of a second RF excitation pulse RF2, so that it may be possible that a dependency of a pulse profile of a second RF excitation pulse RF2 on a k-space position k of the associated second measurement data MDS2 is reduced or even eliminated.

Thus, the computing effort required for correcting disruptive aliasing of the pulse profiles in a k-space recorded and disrupted by the aliasing may be considerably reduced.

Here, a pulse duration of an extended second RF excitation pulse RF2 may be determined dependent on the switching time Ts. As described above, the switching time Ts determines the shortest possible (and thus smallest) echo time TE, at which first measurement data MDS1 may be acquired and thus also determines the smallest value k* of a k-space position, at which first measurement data MDS1 may be acquired. The value k* dependent on the switching time Ts thus corresponds to the smallest distance from the k-space center $k_0$, at which first measurement data MDS1 may be acquired and is thus the smallest k-space position at which a dependency of a pulse profile of a first RF excitation pulse RF1 on a k-space position k of associated first measurement data may be determined, and thus the dependency on k of a pulse profile of a first RF excitation pulse RF1 at which an alignment of a dependency of k of a pulse profile of a second RF excitation pulse RF2 is desired.

The pulse duration of an extended second RF excitation pulse RF2 may be extended inversely proportionally to a respective strength of the second gradients G2 switched for recording the respective k-space positions recorded as second measurement data MDS2 with the extended second RF excitation pulse RF2. Since, as described above, the strength of the switched second gradients G2 behaves proportionally to the k-space position k of associated second measurement data, such an extension of second RF excitation pulses RF2 has an effect on the pulse profile of an extended second RF excitation pulse RF2, which nullifies the effect of the changing strengths of the gradients G2.

Figure 1:
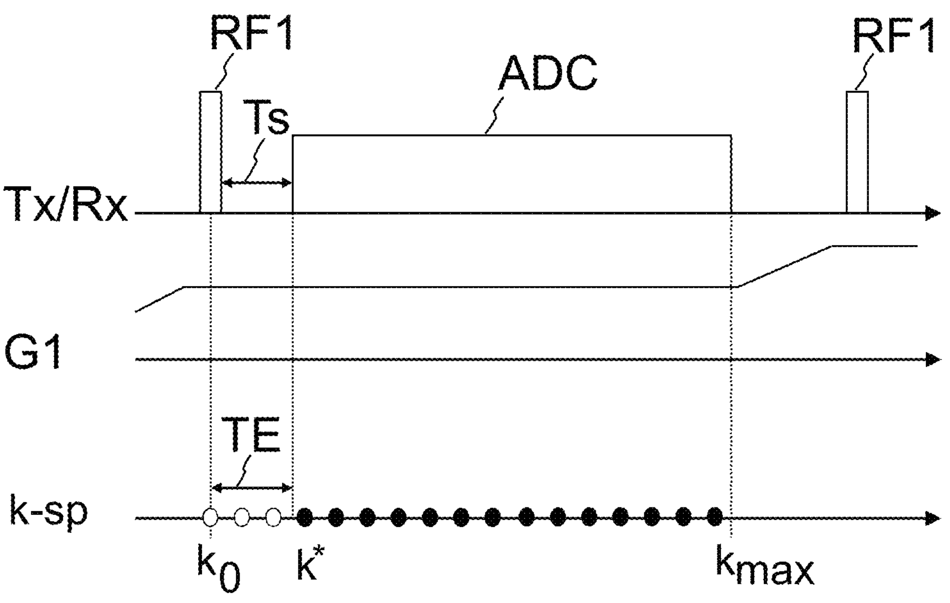
FIG. 1 illustrates a schematically represented part of an example pulse sequence scheme for acquisition of measurement data, in accordance with one or more embodiments of the present disclosure.
Figure 2:
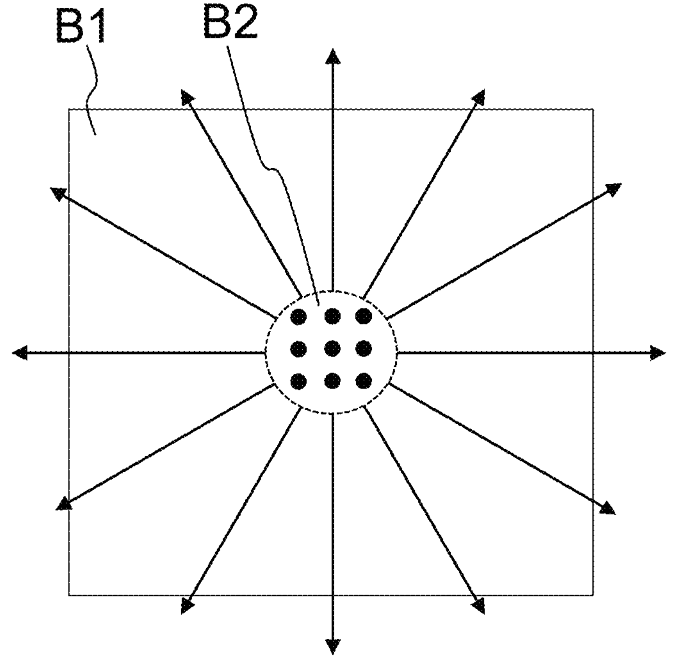
FIG. 2 illustrates a schematically represented exemplary k-space scanning scheme, in accordance with one or more embodiments of the present disclosure.
Figure 3:
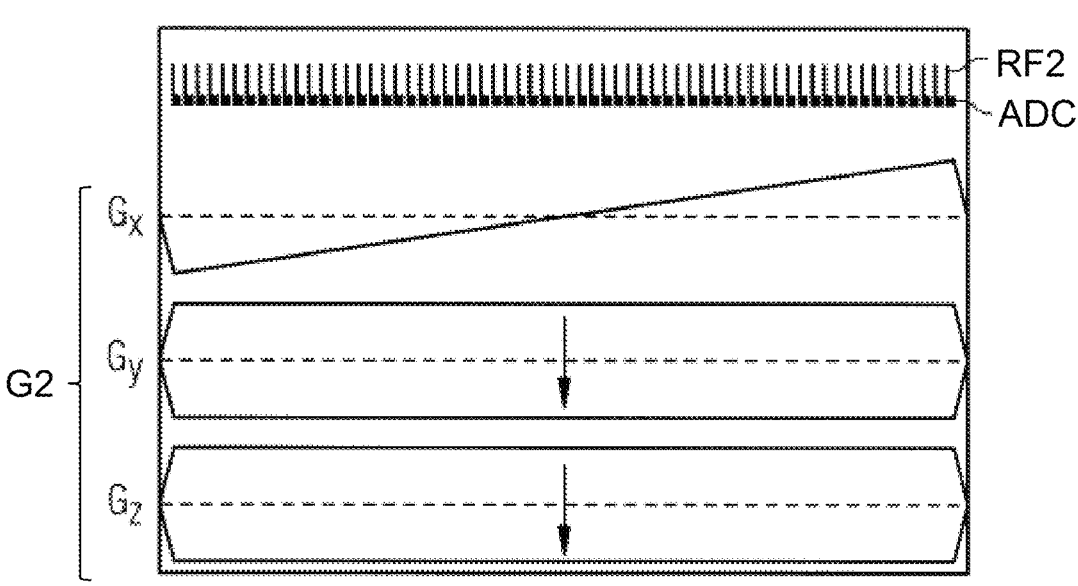
FIGS. 3*a* and 3*b* illustrate schematically represented parts of an example pulse sequence scheme for acquisition of measurement data according to a RASP method, in accordance with one or more embodiments of the present disclosure.
Figure 3:
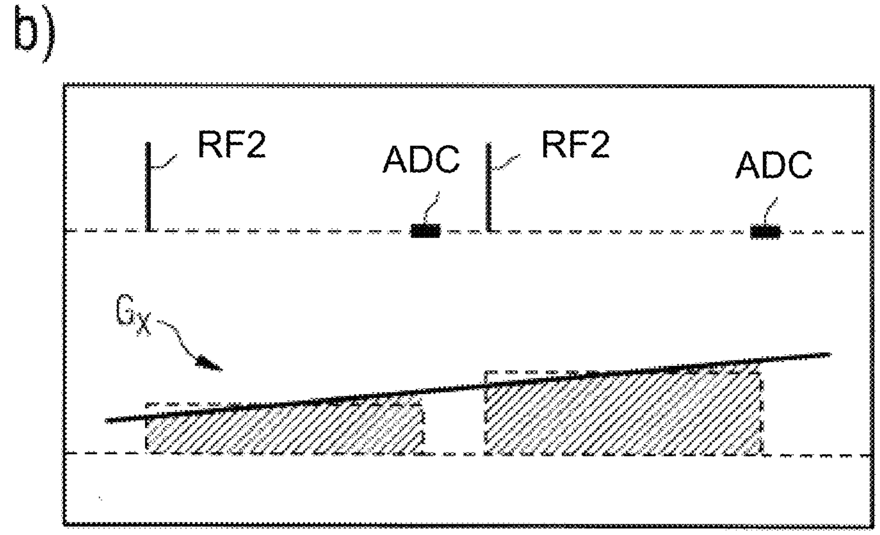
Figure 4:
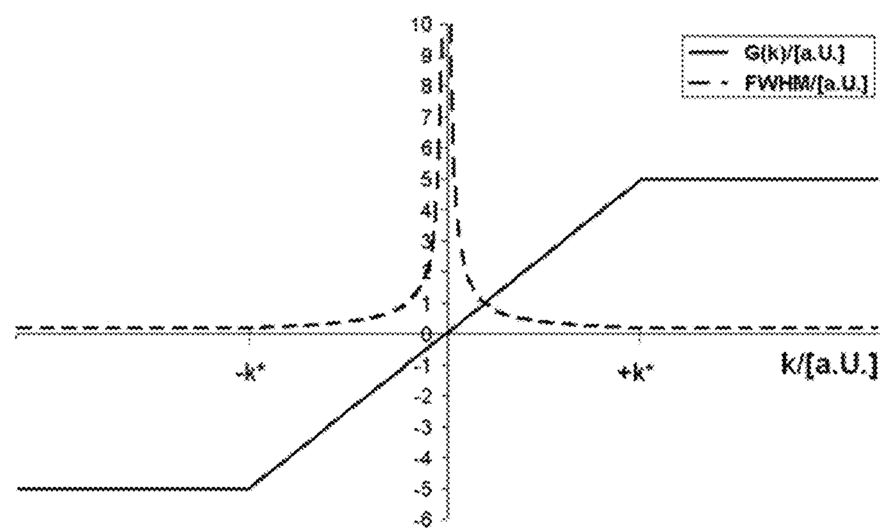
FIG. 4 illustrates a schematic full width half maximum exemplary pulse profiles, in accordance with one or more embodiments of the present disclosure.

In an embodiment, the extension of a pulse duration of a second RF excitation pulse RF2 may thus take place by a factor of $k^*/|k|$. If a pulse duration of a second RF excitation pulse RF2 is extended by a factor of $k^*/|k|$, the zero crossings of the pulse profiles of first excitation pulses RF1 and second RF excitation pulses RF2 for all k-space positions k are the same and a dependency of the pulse profiles on the k-space position k is removed. In FIG. 4 associated full width half maximums of pulse profiles of such extended second RF excitation pulses RF2 (i.e. for $|k|<k^*$) would be the same as the full width half maximums of pulse profiles of the first RF excitation pulses RF1 (i.e. for $|k|\geq k^*$), so that the full width half maximums of the pulse profiles of first RF excitation pulses RF1 and second RF excitation pulses RF2 for all k-space positions k are the same.

A k-space F'(k) disturbed by aliasing with a pulse profile P(x) dependent only on the location x may be expressed in accordance with Equation 2 below as:

$$F'(k) = \sum_x f(x)P(x)e^{ikx}. \quad [2]$$

The equation [2] corresponds to a simple aliasing of the k-space with the pulse profile P(x). Such aliasing may be factored out again by a simple division in the image space, which may be performed with little computing effort.

A second RF-excitation pulse RF2, which is radiated for acquisition of second measurement data MDS2 in the k-space center $k_0$ (k-space position k=0), may be considered a special case, since for an encoding of the k-space center $k_0$ a strength of the switched gradients is equal to zero, and thus it also results in no overlaying (by aliasing) with the associated pulse profile of this second RF excitation pulse RF2.

Therefore, a pulse duration of a second RF excitation pulse RF2 for recording of second echo signals in the k-space center may be arbitrarily selected. For instance, a pulse duration of a second RF excitation pulse RF2 for recording of second echo signals in the k-space center may be selected to be the same as the pulse duration of first RF excitation pulses RF1, so that such a second RF-excitation pulse may be the same as a first RF-excitation pulse RF1.

It is conceivable that specifications in the context of the pulse sequence scheme used, for instance, in relation to a timing of the pulse sequence, do not allow an arbitrary extension of RF excitation pulses used, but that a maximum duration Dm, is specified (Block 105), which should not exceed a radiated RF-excitation pulse. Such a maximum duration Dm may e.g. be dependent upon a desired echo time, after which second echo signals are to be recorded following radiation of a second RF excitation pulse and acquired as second measurement data.

If an extended pulse duration of a second RF excitation pulse RF2 determined dependent on the switching time Ts and inversely proportional to a respective strength of the second gradient switched after the second RF excitation pulse for recording a respective k-space position, would exceed a predetermined maximum duration Dm, the extended pulse duration of this second RF excitation pulse RF2 can be set to the maximum duration Dm. Such cases occur only for k-space positions very close to the k-space center, i.e. for $|k^*-k|<k_{min}$ (where $k_{min}$ denotes the k-space position from which a pulse duration extended inversely proportionally to the k-space position exceeds the maximum duration Dm). An extended pulse duration of second RF excitation pulses RF2 may be held constant at the value of the maximum duration from this k-space position $k_{min}$ to the k-space center $k_0$. In a first approximation, this is possible without problems, because a) only few k-space positions are affected by it and b) the strengths of second gradients G2 for encoding of second measurement data MDS2 for k-space positions with small $k_{min}$ are extremely low and therefore any aliasing that may remain is similarly negligibly low. $k_{min}$ may therefore also be selected as the k-space position from which remaining aliasing is negligibly small.

Blocks 103.1 to 103.5 are repeatedly carried out with different second gradients G2, which in each case encode a desired k-space position, until second echo signals for all desired k-space positions have been recorded and stored as second measurement data MDS2. To this end a query 100' may check if second measurement data MDS2 for all desired k-space positions has been recorded and, if not ("n"), initiate a further recording of second measurement data MDS2 for a further desired k-space position.

In the second area B2, at least one k-space position is recorded. Here, in the second area B2, especially for high strengths of the switched gradients G1, for example of more than 20 mT/m, at least 100 k-space positions, e.g. at a high resolution, for example a resolution of less than one millimeter, or even several thousand k-space positions may be recorded. As the number of k-space positions, at which in the second area B2 second measurement data MDS2 is acquired increases, so does the complexity of the matrix inversion previously necessary for correction of disturbances caused by unwanted slice selection. With the method according to the disclosure, the computing effort for the correction is considerably reduced. The number of k-space positions recorded in the second area B2 increases (with the same coverage) with the maximum (magnitude) strength of second gradients G2 (and thus with an increasing radius k* of the second area B2), since a higher strength of the first gradients G1 leads to a higher k* and thus to a greater radius of the second area B2.

An extension of a pulse duration may be carried out for at least two different RF excitation pulses RF2 associated with k-space positions. The simplification of the correction of the aliasing caused by the unwanted slice selection that may be achieved is greater the more second RF excitation pulse RF2 undergo an extension of their pulse duration. Therefore it may be provided that pulse durations of second RF excitation pulses RF2 are extended for as many as possible, e.g. all k-space positions k with $k_0<k<k_{min}$, at which second measurement data MDS2 is acquired.

From the recorded first measurement data MDS1 and the recorded second measurement data MDS2 by means of a control device of the magnetic resonance system image data BD is reconstructed (Block 107). A reconstruction of the image data BD from the first measurement data MDS1 recorded and the second measurement data MDS2 recorded may comprise a division by a location-dependent pulse profile of the first and second RF excitation pulses RF1, RF2 to correct disturbances caused by an unwanted slice selection.

Figure 6:
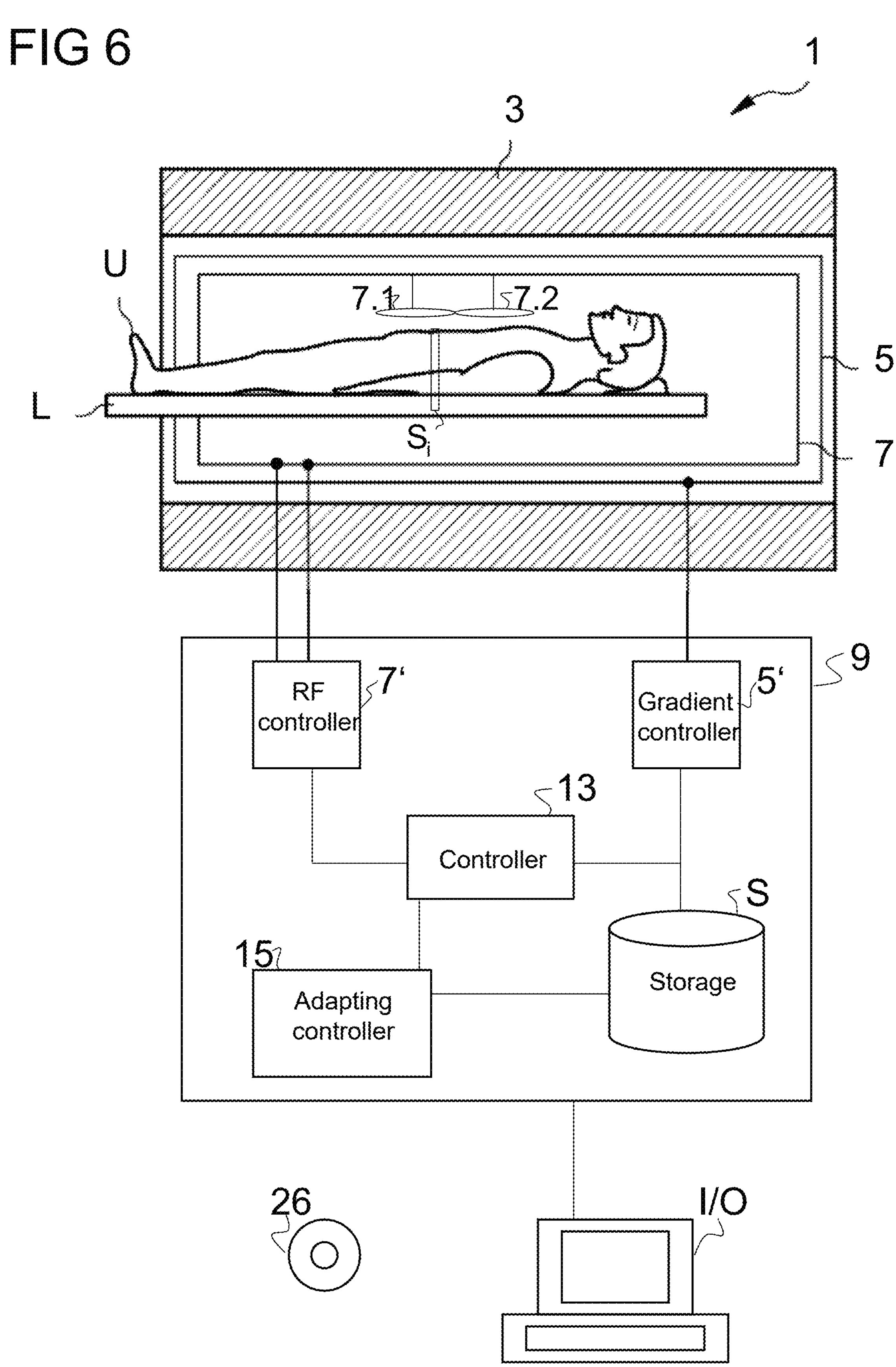
FIG. 6 illustrates a schematically represented example magnetic resonance system, in accordance with one or more embodiments of the present disclosure.

A reconstruction of the image data BD from the recorded first measurement data MDS1 and the recorded second measurement data MDS2 comprises a division by a (largely only) location-dependent profile of the first and second RF excitation pulses. By extending the pulse duration of second RF excitation pulses RF2 according to the disclosure, it is possible to achieve that FIG. 6 is a schematic representation of a magnetic resonance system 1 according to the disclosure. This comprises a magnet unit 3 (also referred to herein as a main magnet) for generating a basic magnetic field, a gradient unit 5 (also referred to herein as a gradient field generator) for generating the gradient fields, a radiofrequency unit 7 (also referred to herein as an RF transceiver) for radiating and receiving radiofrequency signals and a control device 9 (also referred to herein as a controller) designed to carry out a method according to the disclosure.

The schematic in FIG. 6 is a rough representation of these subunits of the magnetic resonance system 1. The radiofrequency unit 7 may comprise a plurality of subunits and for example multiple coils. In an embodiment, the radiofrequency unit 7 may comprise a body coil, that is permanently integrated into the magnetic resonance system 1, and which in turn may for example comprise two antenna elements 7.1 and 7.2.

To examine an examination object U, for example a patient or also a phantom, this may be introduced on a bed L into the magnetic resonance system 1 in its measurement volume. The layer $S_i$ represents an exemplary target volume of an imaging area of the examination object, from which echo signals may be recorded and acquired as measurement data.

The control device 9 serves to control the magnetic resonance system 1 and may for instance control the gradient unit 5 by means of a gradient control 5' (also referred to herein as a gradient controller) and the radiofrequency unit 7 by means of a radiofrequency transmit/receive control 7' (also referred to herein as a radiofrequency (RF) controller). The radiofrequency unit 7 may comprise a plurality of channels, on which signals may be sent or received.

The radiofrequency unit 7, together with its radiofrequency transmit/receive control 7', is responsible for generating and radiating (transmitting) a radiofrequency alternating field for manipulation of the spins in an area to be manipulated (for example, in layers S to be measured) of the examination object U. At the same time, the center frequency of the radiofrequency alternating field, also referred to as the B1 field, is as a rule set such that it lies close to the resonant frequency of the spins to be manipulated. Deviations of the center frequency from the resonant frequency are referred to as off-resonance. To generate the B1 field, in the radiofrequency unit 7 currents controlled by means of the radiofrequency transmit/receive control 7' are applied to the RF coils.

The control device 9 also comprises a pulse duration adaptation unit 15 (also referred to herein as an adapting controller or adapting circuitry) for extending according to the disclosure of pulse durations of second RF excitation pulses. The control device 9 is designed overall to carry out a method according to the disclosure.

A computing unit 13 (also referred to herein as a computing system, computer, or controller) included in the control device 9 is designed to carry out all computing operations required for the necessary measurements and determinations. Intermediate results and results necessary for or determined in the course of this may be stored in a storage unit S (also referred to herein as storage or memory) of the control device 9. The units shown should not necessarily be understood to be physically separate units, but merely represent a subdivision into meaningful units, but which may for example be implemented in fewer of these or also in just a single physical unit.

Through an input/output device I/O of the magnetic resonance system 1 (also referred to herein as a user interface), for example by a user, control commands may be directed to the magnetic resonance system and/or results from the control device 9 such as image data displayed.

A method described herein may also be present in the form of a computer program, comprising commands which carry out the method described on a control device 9. A computer-readable storage medium may also be present, which comprises commands which when executed by a control device 9 of a magnetic resonance system 1 cause this to carry out the method described.

The various components described herein may be referred to as "units." Such components may be implemented via any suitable combination of hardware and/or software components as applicable and/or known to achieve their intended respective functionality. This may include mechanical and/ or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A method for generating measurement data from an imaging area of an examination object located in a measurement volume of a magnetic resonance system, comprising:

reading out a k-space corresponding to the imaging area by:

a) starting up, via a gradient field generator of a magnetic resonance system, a first gradient to a first strength in an encoding direction;

b) radiating, via a radiofrequency (RF) transmit/receive controller of the magnetic resonance system, a first RF excitation pulse while the first gradient is at the first strength;

c) recording, via the RF transmit/receive controller, first echo signals generated by the first RF excitation pulse after a switching time following radiation of a first RF excitation pulse; and d) storing the recorded first echo signals as first measurement data along a k-space trajectory based upon the first strength of the first gradient and the encoding direction;

wherein steps a) to d) are repeated with constant first gradients switched in different encoding directions until the k-space corresponding to the imaging area is read out from a first area based upon the switching time, wherein the different encoding directions are composed of at least two phase encoding directions;

reading out a second area of the k-space corresponding to the imaging area, wherein the second area at least partially is not masked by the first area of the k-space and comprises at least the k-space center, with a single-shot recording method with which, after repeated radiation respectively of each one of second RF excitation pulses, second echo signals are recorded with switching of second gradients for encoding a respective k-space position of the second area and stored as second measurement data until a predetermined number of k-space positions of the second area have been recorded; and reconstructing image data from the recorded first measurement data and the recorded second measurement data;

wherein a pulse duration of at least one of the second RF excitation pulses is extended compared with a pulse duration of first RF excitation pulses for a recording of second echo signals of at least one k-space position in the second area, and wherein a pulse duration of an extended second RF excitation pulse is determined as a function of the switching time.

2. A magnetic resonance system configured to generate measurement data from an imaging area of an examination object located in a measurement volume, comprising:

a main magnet unit;

a gradient generator;

a controller configured to cause:

reading out a k-space corresponding to the imaging area by:

a) starting up, via a gradient field generator of a magnetic resonance system, a first gradient to a first strength in an encoding direction;

b) radiating, via a radiofrequency (RF) transmit/receive controller of the magnetic resonance system, a first RF excitation pulse while the first gradient is at the first strength;

c) recording, via the RF transmit/receive controller, first echo signals generated by the first RF excitation pulse after a switching time following radiation of a first RF excitation pulse; and d) storing the recorded first echo signals as first measurement data along a k-space trajectory based upon the first strength of the first gradient and the encoding direction;

wherein steps a) to d) are repeated with constant first gradients switched in different encoding directions until the k-space corresponding to the imaging area is read out from a first area based upon the switching time, wherein the different encoding directions are composed of at least two phase encoding directions;

reading out a second area of the k-space corresponding to the imaging area, wherein the second area at least partially is not masked by the first area of the k-space and comprises at least the k-space center, with a single-shot recording method with which, after repeated radiation respectively of each one of second RF excitation pulses, second echo signals are recorded with switching of second gradients for encoding a respective k-space position of the second area and stored as second measurement data until a predetermined number of k-space positions of the second area have been recorded; and reconstructing image data from the recorded first measurement data and the recorded second measurement data;

wherein a pulse duration of at least one of the second RF excitation pulses is extended compared with a pulse duration of first RF excitation pulses for a recording of second echo signals of at least one k-space position in the second area, and wherein a pulse duration of an extended second RF excitation pulse is determined as a function of the switching time.

3. A non-transitory computer-readable storage medium having instructions stored thereon that, when executed by a controller of a magnetic resonance system, cause the magnetic resonance system to generate measurement data from an imaging area of an examination object located in a measurement volume by:

reading out a k-space corresponding to the imaging area by:

a) starting up, via a gradient field generator of a magnetic resonance system, a first gradient to a first strength in an encoding direction;

b) radiating, via a radiofrequency (RF) transmit/receive controller of the magnetic resonance system, a first RF excitation pulse while the first gradient is at the first strength;

c) recording, via the RF transmit/receive controller, first echo signals generated by the first RF excitation pulse after a switching time following radiation of a first RF excitation pulse; and d) storing the recorded first echo signals as first measurement data along a k-space trajectory based upon the first strength of the first gradient and the encoding direction;

wherein steps a) to d) are repeated with constant first gradients switched in different encoding directions until the k-space corresponding to the imaging area is read out from a first area based upon the switching time, wherein the different encoding directions are composed of at least two phase encoding directions;

reading out a second area of the k-space corresponding to the imaging area, wherein the second area at least partially is not masked by the first area of the k-space and comprises at least the k-space center, with a single-shot recording method with which, after repeated radiation respectively of each one of second RF excitation pulses, second echo signals are recorded with switching of second gradients for encoding a respective k-space position of the second area and stored as second measurement data until a predetermined number of k-space positions of the second area have been recorded; and reconstructing image data from the recorded first measurement data and the recorded second measurement data;

wherein a pulse duration of at least one of the second RF excitation pulses is extended compared with a pulse duration of first RF excitation pulses for a recording of second echo signals of at least one k-space position in the second area, and wherein a pulse duration of an extended second RF excitation pulse is determined as a function of the switching time.

4. The method as claimed in claim 1, wherein the pulse duration of an extended one of the second RF excitation pulses is extended such that a dependency of a pulse profile of the first RF excitation pulse on a k-space position of first measurement data, and a dependency of the pulse profile of an extended second RF excitation pulse on a k-space position of associated second measurement data, are aligned.

5. The method as claimed in claim 1, wherein the pulse duration of an extended one of the second RF excitation pulses is extended inversely proportional to a respective strength of second gradients switched for recording the respective k-space positions recorded as second measurement data with the extended one of the second RF excitation pulses.

6. The method as claimed in claim 1, wherein a pulse duration of a second RF excitation pulse for recording second echo signals in the k-space center is random.

7. The method as claimed in claim 1, wherein a pulse duration of a second RF excitation pulse for recording of second echo signals in the k-space center is the same as a pulse duration of first RF excitation pulses.

8. The method as claimed in claim 1, wherein a pulse duration of an extended one of the second RF excitation pulses is less than a predetermined maximum duration.

9. The method as claimed in claim 1, wherein a pulse duration of an extended one of the second RF excitation pulses, when it is determined based on the switching time of a second gradient and inversely proportional to a respective strength of the second gradient, which is switched after a respective one of the second RF excitation pulses for recording a respective k-space position exceeds a maximum duration dependent on a desired echo time, following which second echo signals are recorded following radiation of a respective one of the second RF excitation pulses and recorded as second measurement data, is set to the maximum duration.

10. The method as claimed in claim 1, wherein in the second area k-space positions are recorded in a range between 100 and 1000, and/or a strength used of the first gradient is in a range between 15 mT/m and 20 mT/m.

11. The method as claimed in claim 1, wherein a reconstructing the image data from the recorded first measurement data and the recorded second measurement data comprises a division by a location-dependent profile of the first and the second RF excitation pulses.

* * * * *